US011774811B2

(12) United States Patent
Nakamura et al.

(10) Patent No.: US 11,774,811 B2
(45) Date of Patent: Oct. 3, 2023

(54) DISPLAY DEVICE HAVING THROUGH HOLES WITHOUT OVERHANG IN CROSS SECTION

(71) Applicant: Japan Display Inc., Tokyo (JP)

(72) Inventors: Hidetatsu Nakamura, Tokyo (JP); Yasuhiro Kanaya, Tokyo (JP); Gen Koide, Tokyo (JP); Hiroyuki Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 281 days.

(21) Appl. No.: 17/074,980

(22) Filed: Oct. 20, 2020

(65) Prior Publication Data

US 2021/0036031 A1 Feb. 4, 2021

Related U.S. Application Data

(63) Continuation of application No. PCT/JP2019/015101, filed on Apr. 5, 2019.

(30) Foreign Application Priority Data

Apr. 27, 2018 (JP) ................................. 2018-086372

(51) Int. Cl.
*G02F 1/1345* (2006.01)
*G02F 1/1333* (2006.01)
(Continued)

(52) U.S. Cl.
CPC ........ *G02F 1/13458* (2013.01); *G02F 1/1345* (2013.01); *G02F 1/13629* (2021.01);
(Continued)

(58) Field of Classification Search
CPC .......................... G02F 2202/104; H01L 23/60
See application file for complete search history.

(56) References Cited

U.S. PATENT DOCUMENTS

2013/0194532 A1 8/2013 Morita
2015/0116618 A1* 4/2015 Kita ...................... G02F 1/1345
349/43
(Continued)

FOREIGN PATENT DOCUMENTS

JP 2013-152409 A 8/2013

OTHER PUBLICATIONS

International Search Report dated Jul. 2, 2019 for the PCT application No. PCT/JP2019/015101, with English translation.

*Primary Examiner* — Paisley L Wilson
(74) *Attorney, Agent, or Firm* — Michael Best & Friedrich LLP

(57) ABSTRACT

The purpose of the present invention is to prevent an overhang in a through hole in the display area when through holes in the organic passivation film in the display area and in the terminal area are simultaneously formed. The structure to realize this purpose is as follows: the terminal area having a lead wire, formed from a first metal, and extending to the display area, a first insulating film covering the lead wire, a second metal formed on the first insulating film, and a third metal formed on the surface of the second metal, wherein the first insulating film has a first through hole and a second through hole, the second metal has a first portion that connects with the lead wire via the first through hole, the second metal has a second portion that overlaps the second through hole, the second portion is separated from the first portion.

11 Claims, 22 Drawing Sheets

(51) Int. Cl.
*G02F 1/1362* (2006.01)
*H01L 23/60* (2006.01)
*H01L 27/12* (2006.01)
*G02F 1/1343* (2006.01)

(52) U.S. Cl.
CPC .. *G02F 1/133345* (2013.01); *G02F 1/136204* (2013.01); *H01L 23/60* (2013.01); *H01L 27/1244* (2013.01); *H01L 27/1248* (2013.01); *G02F 1/13338* (2013.01); *G02F 1/134363* (2013.01); *G02F 2202/104* (2013.01)

(56) References Cited

U.S. PATENT DOCUMENTS

2017/0062548 A1\* 3/2017 Han ................. H01L 29/41733
2017/0235182 A1\* 8/2017 Abe ................. G02F 1/134309
257/72

\* cited by examiner

DISPLAY DEVICE HAVING THROUGH HOLES WITHOUT OVERHANG IN CROSS SECTION

CLAIM OF PRIORITY

The present application is a continuation application of International Application No. PCT/JP2019/015101, filed Apr. 5, 2019, which claims priority to Japanese Patent Application No. 2018-086372, filed on Apr. 27, 2018. The contents of these applications are incorporated herein by reference in their entirety.

BACKGROUND OF THE INVENTION

(1) Field of the Invention

The present invention relates to the display device, specifically to a structure to counter measure a disconnection in a though hole in an organic insulating film.

(2) Description of the Related Art

The liquid crystal display device has such a structure that the TFT substrate, in which the pixels, which have the pixel electrodes and the TFTs (Thin Film Transistor), are arranged in matrix, and the counter substrate in which black matrix and so forth are formed, are opposite to each other with the liquid crystal being sandwiched therebetween. The images are formed by controlling the light transmittance in the liquid crystal in each of the pixels.

The organic EL display device has a light emitting layer in each of the pixels; the images are formed by controlling the light emitted from each of the light emitting layers electrically connected with the switching TFTs and the driving TFTs.

Each of the TFTs, controlled by scan signals from the scan signal line, and supplies video signals to the pixel electrode from the video signal line. The video signals, powers, common voltage and so forth are supplied through the terminals. Several conductive layers are stacked in the terminal; the metal layer tends to get oxide film on the surface during the manufacturing process and after the process; the oxide film deteriorates the conductance at the terminal. An increase in the resistance of the terminal deteriorates the reproducibility of images.

Patent document 1 discloses to suppress an increase in resistance in the terminal by preventing the lower metal layer of the terminal from being oxidized in the IPS (In Plane Switching) mode or FFS (Fringe Field Switching) mode liquid crystal display device.

Patent document 1: Japanese patent application laid open No. 2013-152409

SUMMARY OF THE INVENTION

A thick organic insulating film (herein after organic passivation film) of e.g. 1.5 to 3 micron is used as a flattening film or to decrease a floating capacitance between multilayered wirings. The organic EL display device uses two layers of such organic passivation films. Some of the liquid crystal display devices that have touch sensor functions use two layers of such organic passivation films.

Wirings are formed on the organic passivation film; the wirings connect with the terminals via through holes formed in the organic passivation film. The terminal has a laminated structure of plural conductive films and plural insulating films to maintain reliability in electrical connection.

Forming terminals are made in a same process as forming the display area. Namely, the through holes in the insulating layer in the display area are formed simultaneously as the through holes in the terminal area; the wirings in the display area and the wirings in the terminal area are connected with each other. In addition, through holes are formed in the intermediate area, in which connecting routes are formed between the wirings in the terminal area and the wirings in the display area, for changing wiring layers.

In the meantime, when a through hole is formed in the insulating film, especially in the organic passivation film, patterning is made with developing solution after exposure; the existence of the developing solution tends to generate a local cell action in the metal layer formed under the through hole. The local cell action influences the cross sectional structure of the through hole, which arises a danger of disconnection in the through hole. Concretely, the cell action generates an overhang in cross sectional view in the vicinity of the bottom of the through hole.

The display area, the intermediate area and the terminal area are connected with wirings. Therefore, charges generated by local cell action can move mutually between the through holes in the display area, the through holes in the intermediate area and the through holes in the terminal area.

The influence of the local cell action conspicuously appears in the relatively small through holes in the display area and in the intermediate area. Therefore, the disconnections in the through holes tend to occur in the display area and in the intermediate area.

The purpose of the present invention is to counter measure the overhang in the vicinity of the bottom of the through hole formed in the organic passivation film; and thus, to prevent the disconnection in the through hole; consequently, to realize the display device having high reliability.

The present invention solves the above explained problem; the representative structure is as follows. Namely, a display device comprising a display area and a terminal area in which terminals are formed:

the terminal area having a lead wire, formed from a first metal, and extending to the display area, a first insulating film covering the lead wire, a second metal formed on the first insulating film, and a third metal formed on the surface of the second metal, wherein the first insulating film has a first through hole and a second through hole, the second metal has a first portion that connects with the lead wire via the first through hole, the second metal has a second portion that overlaps the second through hole, the second portion is separated from the first portion.

DETAILED DESCRIPTION OF THE PREFERRED EMBODIMENTS

The present invention is explained in the following embodiments in detail. In the explanation below, although the present invention is explained when it is used in the liquid crystal display device, the present invention is similarly used in the organic EL display device. Further, although the present invention is explained for the liquid crystal display device of IPS mode having a touch sensor function, the present invention is applicable to the liquid crystal display device that does not have a touch sensor function; the present invention is also applicable to the liquid crystal display device other than the IPS mode.

Figure 1:
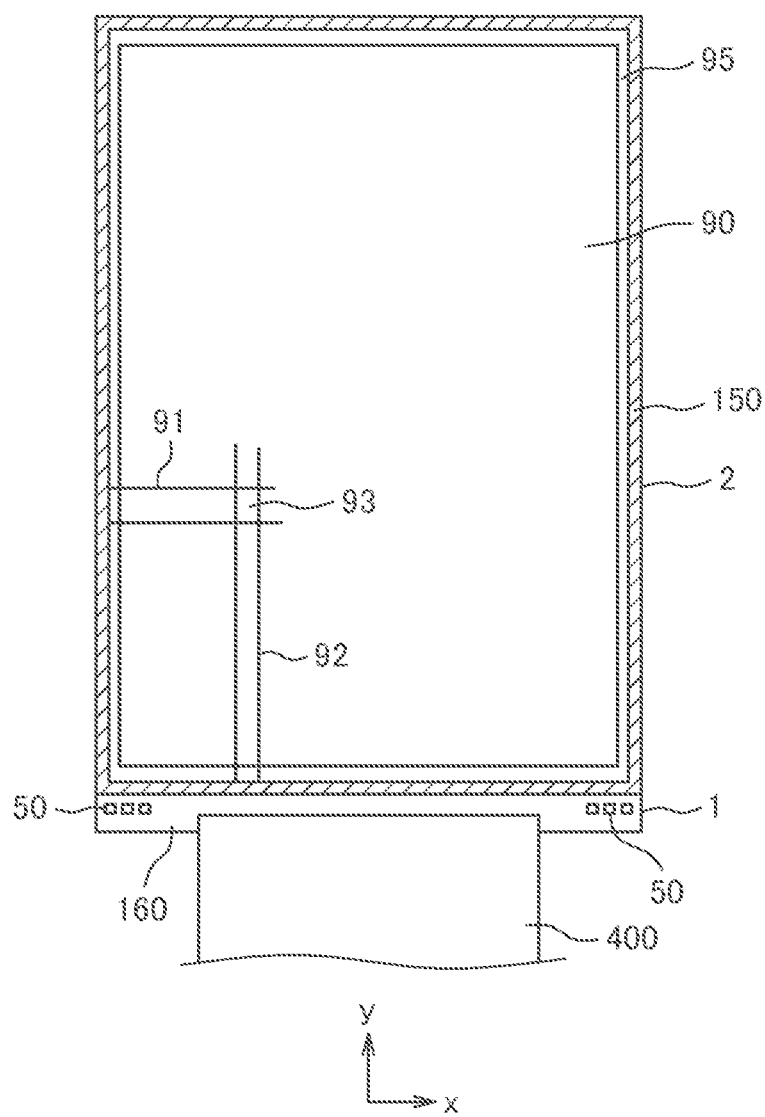
FIG. 1 is a plan view of the liquid crystal display device.

FIG. 1 is a plan view of the liquid crystal display device to which the present invention is applied. In FIG. 1, the TFT substrate 1 and the counter substrate 2 are adhered by seal material 150; the display area 90 is formed in an area surrounded by the seal material 150. The peripheral area including the seal material 150 is the frame area 95. In the TFT substrate 1, the scan signal lines 91 extend in lateral direction (x direction) and are arranged in longitudinal direction (y direction); the video signal lines 92 extend in longitudinal direction and are arranged in lateral direction in the display area 90. The pixel 93 is formed in an area surrounded by the scan signal lines 91 and the video signal lines 92.

The TFT substrate 1 is made larger than the counter substrate 2; the terminal area 160 is formed in the area in which the TFT substrate 1 does not overlap with the counter substrate 2. The flexible wiring substrate 400 connects to the terminal area 160 to supply powers and signals to the liquid crystal display device. The terminals to connect with the flexible wiring substrate 400 are formed in the terminal area 160 in FIG. 1; those terminals may be referred to as FOG (Film On Glass) terminals herein after. In addition to the FOG terminals, inspection terminals 50 are formed in the terminal area 160.

Figure 2:
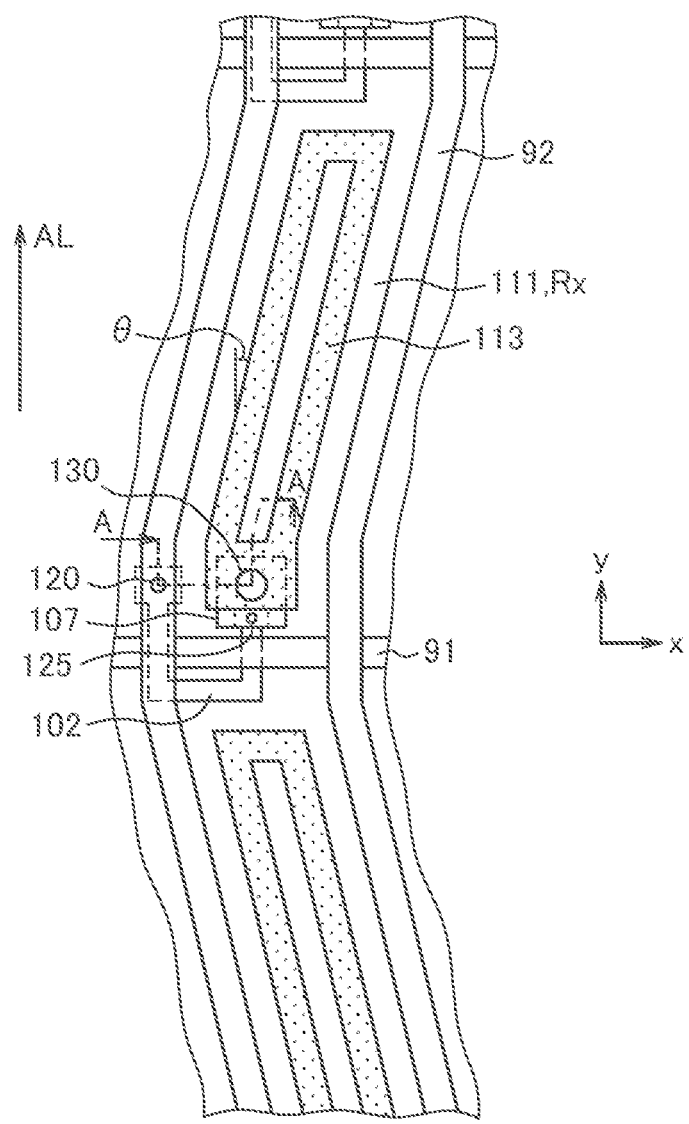
FIG. 2 is a plan view of the pixel in the display area.

FIG. 2 is a plan view of the pixel 93 in the TFT substrate 1. FIG. 2 is a plan view of the pixel 93 of the IPS mode liquid crystal display device. In FIG. 2, the scan signal lines 91 extend in lateral direction (x direction) and are arranged in longitudinal direction (y direction). The video signal lines 92 extend in lateral direction; however, in an area adjacent to the comb like portion of the pixel electrode 113, the video signal lines 92 extend in directions tilting θ or −θ degree with respect to y direction. The pixel electrode 113 is formed in the area surrounded by the scan signal lines 91 and the video signal lines 92. The pixel electrode 113 comprises the comb like electrode and the contact area, which overlaps with the through hole 130. The common electrode 111 is formed under the pixel electrode 113 via the capacitance insulating film.

The pixel electrode 113 is formed tilting θ degree with respect to y direction as the video signal lines 92 is. The alignment direction (AL) in the alignment film is y direction. According to this structure, the rotation direction of the liquid crystal molecules is determined when a signal voltage is applied to the pixel electrode 113; thus, generation of domains is suppressed. The semiconductor film 102 is formed under the video signal line 92 and the scan signal line 91 via the insulating films. The TFT is formed where the semiconductor film 102 passes under the scan signal line 91. In this case, the scan signal line 91 works as the gate electrode. Therefore, two TFTs are formed in the structure of FIG. 2.

In FIG. 2, the semiconductor film connects with the video signal line 92 in the through hole 120 and connects with the source electrode 107 in the through hole 125. The source electrode 107 connects with the pixel electrode 113 in the through hole 130.

Figure 3:
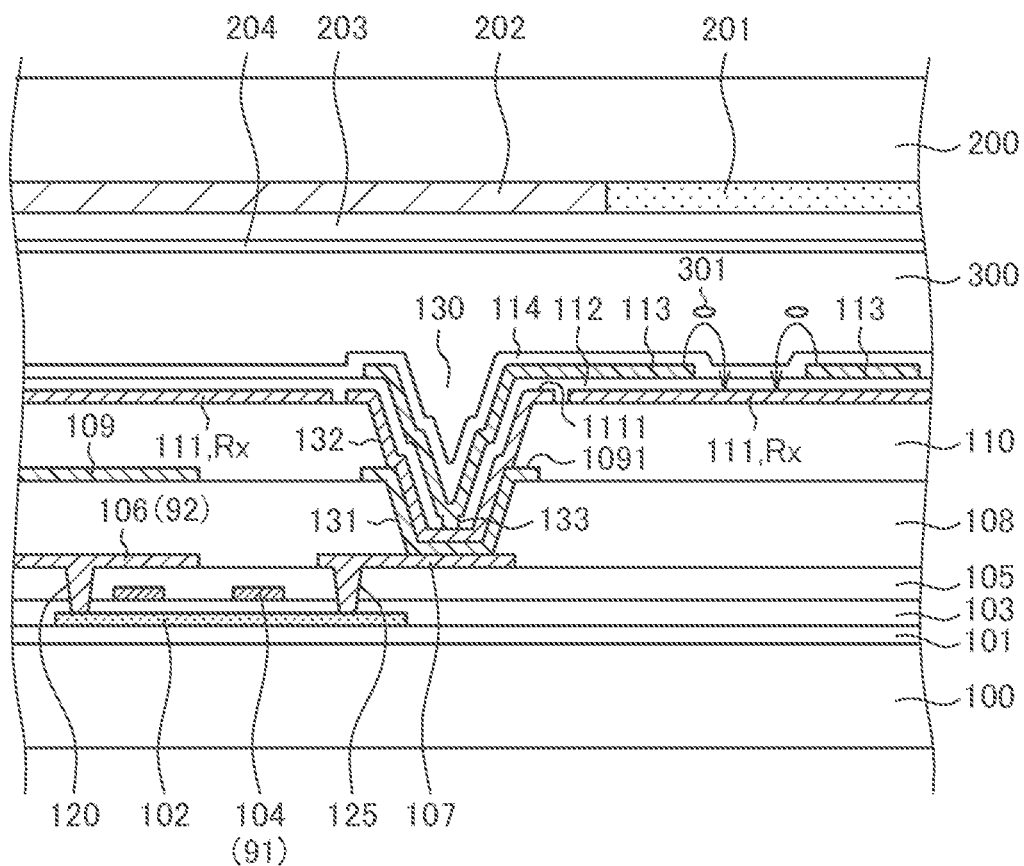
FIG. 3 is a cross sectional view of FIG. 2 along the line A-A.

FIG. 3 is a cross sectional view along the line A-A in FIG. 2. In FIG. 3, as to the TFT substrate 1, the under coat film 101 is formed on the insulating substrate 100 to prevent the semiconductor film 102 from being contaminated with impurities in the insulating substrate 100. The under coat film 101 is, generally, a laminated film formed from the silicon oxide film (represented by SiO film herein after) and the silicon nitride film (represented by SiN film herein after). A thickness of the SiO film is e.g. 200 nm, and a thickness of the SiN film is e.g. 20 nm.

In FIG. 3, the semiconductor film 102 is formed on the under coat film 101. The semiconductor film 102 is a polysilicon film, which is converted from the a-silicon film, formed by CVD, with excimer laser. A thickness of the semiconductor film 102 is e.g. 50 nm. The semiconductor film 102 is used as the discharge lines 36, which extend to the edge of the insulating substrate 100, in the terminal area 160. In the meantime, the SiO film and the SiN film, which constitute the under coat film 101, and the a-silicon film, which is to be converted to the polysilicon film 102, are formed continuously by CVD with changing the materials. The gate insulating film 103 is formed covering the semiconductor film 102. The gate insulating film 103 is a SiO film that is formed by CVD using TEOS (Tetra Ethyl Ortho Sylicate) as the material. A thickness of the gate insulating film 103 is e.g. 100 nm.

In FIG. 3, the gate electrode 104, namely the scan signal line 91, is formed on the gate insulating film 103. The gate electrode 104 is formed from e.g. MoW alloy; a thickness is e.g. 250 nm. Wirings in the terminal area 160 are formed simultaneously with the gate electrode 104 and the scan signal line 91. The interlayer insulating film 105, formed from a laminated film of the SiO film and the SiN film, is formed covering the gate electrode 104. The laminated film of the interlayer insulating film 105 is constituted from the SiO film of a thickness of 400 nm and the SiN film of a thickness of 250 nm.

The video signal line 92, which works as the drain electrode 106, and the source electrode 107, which connects with the pixel electrode 113, are formed on the interlayer insulating film 105. The video signal line 92 (drain electrode 106) and the source electrode 107 are formed simultaneously, and are laminated film of e.g. Titanium Nitride (TiN)-Titanium (Ti)-Aluminum (Al)-Titanium (Ti). TiN is used to suppress the reflection of the external light. Thicknesses of the TiN/Ti/Al/Ti are e.g. 8 nm/45 nm/500 nm/130 nm. Wirings or electrodes formed simultaneously with the video signal lines 92 are also used as wrings or electrodes of the terminals in the terminal area 160.

The first organic passivation film 108 is formed from e.g. acrylic resin covering the video signal line 92 (the drain electrode 106) and the source electrode 107. This acrylic resin is formed from e.g. photo sensitive positive type resist. The first organic passivation film 108 is made thick as 2.5 micron to decrease a floating capacitance between the video signal lines 92 and the common wirings 109.

The common wiring 109 is formed on the first organic passivation film 108 to supply a common voltage or touch sensor signals to the common electrode 111 or the electrode to be an Rx electrode. The common wiring 109 can be formed from a laminated film of TiN/Ti/Al/Ti (may be referred to as TAT herein after) as the video signal line 92 or a laminated film of Molybdenum (Mo)-Aluminum (Al)-Molybdenum (Mo) (may be referred to as MAM herein after). Thicknesses of the Mo/Al/Mo are e.g. 10 nm/177 nm/10 nm. Wirings or electrodes formed simultaneously with the common wirings 109 can also be used as wrings or electrodes in the terminal area 160.

The through hole 131 is formed in the first organic passivation film 108 to connect the pixel electrode 113, which is formed later, with the source electrode 107. The first pedestal 1091 is formed by the same material and the same process as the common wirings 109 in the through hole 131 to secure the connection between the pixel electrode 113 and the source electrode 107. By the way, the common wirings 109 and the first pedestal 1091 are insulated to each other.

The second organic passivation 110 is formed from e.g. acrylic resin covering the common wirings 109 and the first organic passivation film 108. This acrylic resin is also photosensitive positive type resist. The common electrode 111, which is made of a transparent conductive film as e.g. ITO (Indium Tin Oxide), is formed on the second organic passivation film 110. By the way, when the liquid crystal display device is used as a touch sensor, the common electrode 111 works as the sensor electrode Rx of the touch sensor. When the common electrode 111 is used as the electrode Rx of the touch sensor, the common electrodes 111 in plural pixels are integrated to form the electrode Rx. The second organic passivation 110 is made thick as 1.5 micron to decrease a floating capacitance between the video signal lines 92 and the common electrodes 111 or the common wirings 109. A total thickness of the first organic passivation film 108, which has a thickness of 2.5 micron, and the second organic passivation film 110, which has a thickness of 1.5 micron, is 4 micron; thus, total 4 micron thickness of acrylic resin exists between the common electrode 111 and the video signal lines 92, consequently, a capacitance between the video signal lines 92 and the common electrode 111 can be made small.

The through hole 132 is formed in the second organic passivation film 110 to connect the pixel electrode 113, which is formed later, to the source electrode 107. The second pedestal 1111 is formed by the same material and the same process as the common electrode 111 in the through hole 132 to secure the connection between the pixel electrode 113 and the source electrode 107. In the meantime, the common electrode 111 and the second pedestal 1111 are insulated to each other.

The ITO film, which constitutes the common electrode 111, is used as the first ITO film 10, which has a role of a protection layer for the terminal electrode, in the terminal area. A thickness of the common electrode 111 is e.g. 50 nm.

The capacitance insulating film 112 is formed from SiN covering the common electrode 111 and so forth. A thickness of the capacitance insulating film 112 is approximately 75 to 150 nm, and is typically approximately 120 nm. The capacitance insulating film 112 is made thin when a holding capacitance between the common electrode 111 and the pixel electrode 113 is required to be large. In the meantime, the capacitance insulating film 112 is used as a protection film in the terminal area 160.

The pixel electrode 113 is formed on the capacitance insulating film 112. The shape of the pixel electrode 113 is shown in FIG. 2. The pixel electrode 113 is formed from a transparent conductive film as ITO; a thickness of the pixel electrode 113 is e.g. approximately 40 nm. The pixel electrode 113 extends into the through hole 130 (131 and 132) and connects with the source electrode 107. In the meantime, the first pedestal 1091 and the second pedestal 1111 are formed in the through hole 130 to secure the connection between the source electrode 107 and the pixel electrode 113.

The ITO film, which constitutes the pixel electrode 113, is used as the second ITO film 20, which has a role of a protection layer for the terminal electrode, in the terminal area 160. Therefore, the terminal is protected by two layers, namely, the first ITO film 10, which is formed simultaneously with the common electrode 111, and the second ITO film 20, which is formed simultaneously with the pixel electrode 113.

The alignment film 114 is formed covering the pixel electrode 113. As to the alignment film 114, either the one that experienced rubbing process or the one that experienced photo alignment process by polarized ultra violet ray can be used. Since pre-tilt angle is not necessary in the case of IPS mode liquid crystal display device, the photo alignment process is more suitable for the alignment film in the IPS mode liquid crystal display device.

When a video signal is applied to the pixel electrode 113, lines of forces through the liquid crystal layer 300 are generated as depicted in FIG. 3, thus, the liquid crystal molecules 301 rotate and consequently, a light transmittance in the liquid crystal layer 300 is controlled. The light from the back light is controlled in each of the pixels, thus, images are formed.

In FIG. 3, the counter substrate 2 is set opposing to the TFT substrate 1 sandwiching the liquid crystal layer 300 therebetween. As to the counter substrate 2, the color filter 201 and the black matrix 202 are formed on the insulating substrate 200 as e.g. the glass substrate. The color filter 201, which is formed in the transparent region in the pixel corresponding to the pixel electrode 113, forms color images. On the other hand, the black matrix 202 covers the through hole 130 and the TFT to maintain contrast of the images.

The overcoat film 203 is formed covering the color filter 201 and the black matrix 202. The role of the overcoat film 203 is: to prevent an intrusion of the pigments in the color filter 201 into the liquid crystal layer 300, and to form a flat surface. The alignment film 204 is formed on the overcoat film 203. The alignment process for the alignment film 204 is the same as that for the alignment film 114 on the TFT substrate 1.

Figure 4:
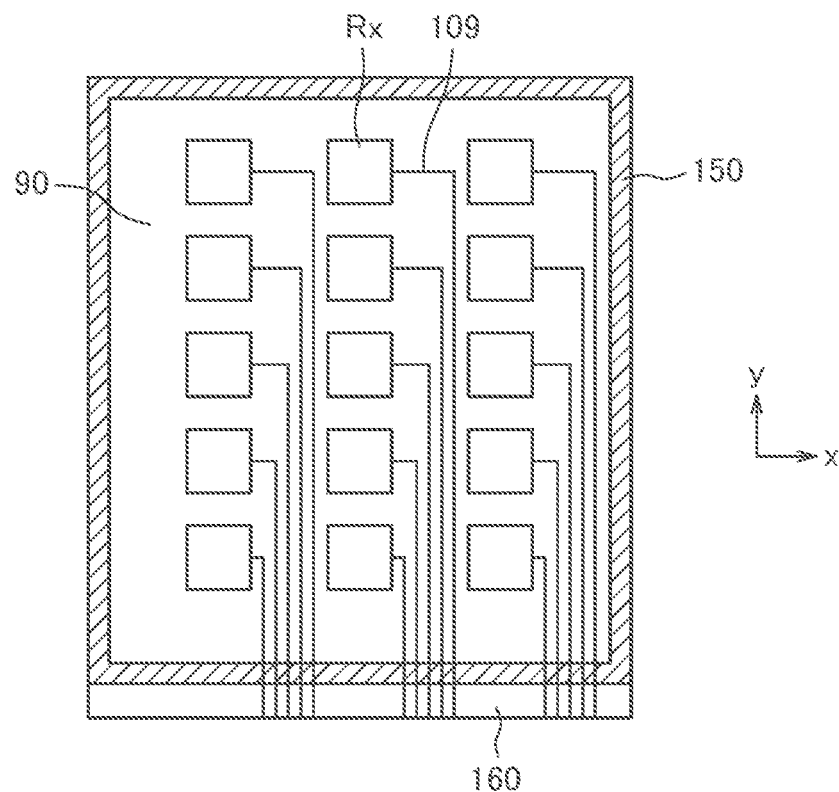
FIG. 4 is a plan view of the touch sensor that is installed in the liquid crystal display device.

FIG. 4 is a plan view of the touch sensor that is installed in the liquid crystal display device shown in FIG. 3. There are a self-capacitance method and a mutual capacitance method in the touch sensor. In the self-capacitance method, a change in capacitance between a finger of the human being and the electrode is detected, and a single Rx electrode is necessary at the detecting position. In the mutual capacitance method, an electrical field between two electrodes are formed, and a change in the field is detected when a finger of the human being touches. Since each of the detection positions requires two electrodes in the mutual capacitance method, more lead wirings are necessary. FIG. 4 is a schematic plan view of the self-capacitance method touch sensor.

In FIG. 4, the sensor electrodes Rx are arranged in lateral direction and in longitudinal direction in the display area 90 surrounded by the seal material 150. The common wirings 109, which extend to the terminal area 160, supply voltages to each of the sensor electrodes Rx. The Rx electrode in FIG. 4 is the sensor electrode for detecting the touch position; a plurality of the common electrodes 111 in pixels shown in FIGS. 2 and 3 are integrated to form one Rx electrode. In FIG. 4, three Rx electrodes are arranged in lateral direction (x direction) and five Rx electrodes are arranged in longitudinal direction (y direction) for simplification of the drawing; however, in the actual products, for example, 60 to 70 Rx electrodes are arranged in lateral direction and 60 to 70 Rx electrodes are arranged in longitudinal direction.

Figure 5:
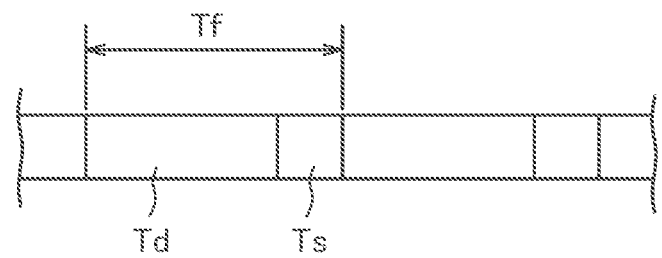
FIG. 5 is a diagram that shows a behavior of the liquid crystal display device in which the touch sensor is installed.

FIG. 5 is a diagram that shows a behavior of the liquid crystal display device in which the touch sensor is installed. In FIG. 5, one frame period Tf is divided into the image display period Td and the touch sensor period Ts. During the image display period Td, the common voltage is supplied to the common electrode 111 through the common wiring 109. On the other hand, during the touch sensor period Ts, the sensor voltage is supplied to the common electrode 111 through the common wiring 109. The display period Td and the touch sensor period Ts are switched to each other by a driver IC in the flexible wiring substrate 400 in FIG. 1.

Figure 6:
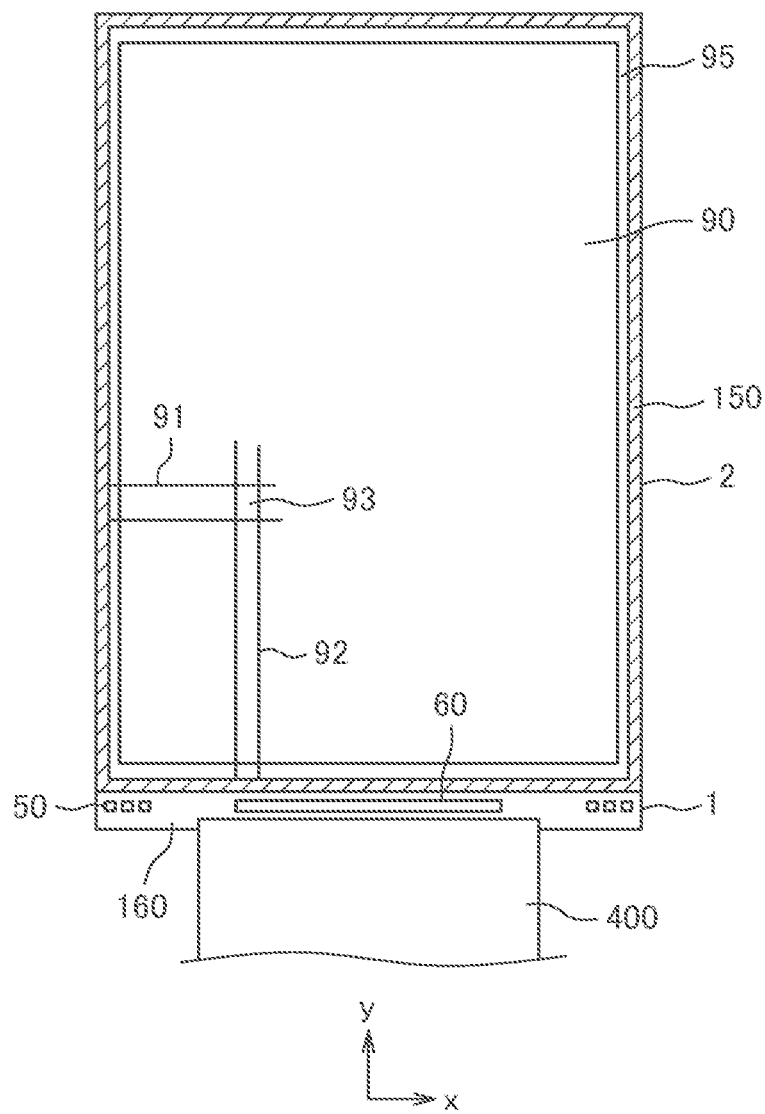
FIG. 6 is a plan view of the liquid crystal display device in which the IC driver is installed in the terminal area.

In FIG. 1, a driver IC is installed on the flexible wiring substrate 400; however, a driver IC is installed on the terminal area 160 in other cases. FIG. 6 is a case where the driver IC 60 is installed on the terminal area 160. In FIG. 6, the wirings from the display area 90 connect to the driver IC 60; the wirings from the driver IC 60 connect to the flexible wiring substrate 400. The terminals for connecting the driver IC 60 are called COG (Chip On Glass) terminals.

A through hole is formed in the insulating film to form a terminal in the terminal area 160. Through holes are formed in the display area 90 and in the intermediate area, which is between the display area 90 and the terminal area 160, to change the layer of the wirings; however, sizes of the through holes in the terminal are much larger than the through holes in the display area 90 and in the intermediate area. On the other hand, the terminals connect with the wirings formed in the display area and in the intermediate area. The intermediate area is an area between the display area 90 and the terminal area 160; concretely, the intermediate area can be a part of the peripheral area 95 where the TFT substrate 1 and the counter substrate 2 overlap with each other, and further can be an area that the TFT substrate 1 and the counter substrate 2 do not overlap with each other. Various wirings are formed in the intermediate area for driving the display device as for the gate driving circuit, the video signal driving circuit formed in the peripheral area 95, and so on.

In relating to the structure in which a large through hole in the terminal and a small though hole, which is simultaneously formed with the large through hole, in the display area 90 or in the intermediate area are electrically connected with each other, the inventors found that an abnormal cross sectional shape in the small through hole in the insulating film, specifically in the organic passivation film, is generated. Concretely, the problem is an overhang formed in the vicinity of the bottom of the through hole in a cross sectional view. As explained later, the present invention is to counter measure the abnormal cross sectional shape in the through hole, especially formed in the organic passivation film.

Large through holes are formed in the FOG terminals, the COG terminals and the inspection terminals 50 in the terminal area 160; small through holes are formed in the intermediate area and in the display area 90. The present invention counter measures the abnormal cross sectional shapes in the small through holes when the large through holes and the small through holes are connected with each other by wirings; therefore, in the specification herein after, the terminals in the terminal area 160 are represented by the FOG terminals, which are for a connection with the flexible wiring substrate 400.

Figure 7:
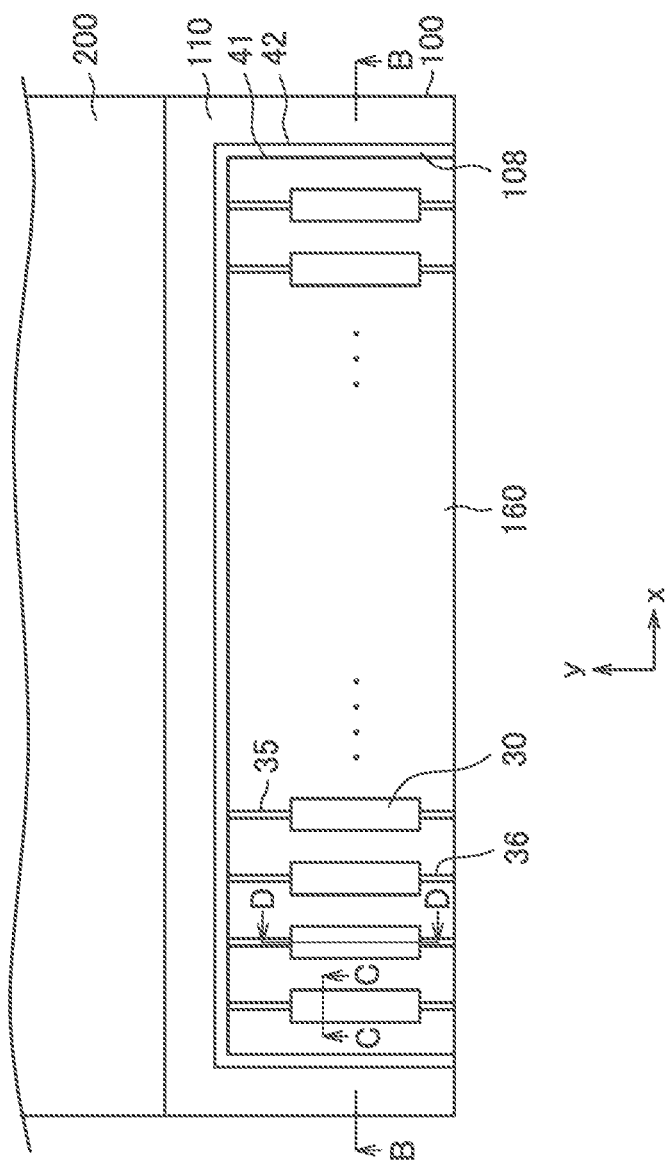
FIG. 7 is an enlarged plan view of the terminal area corresponding to FIG. 1.

FIG. 7 is a plan view of the terminal area 160 corresponding to FIG. 1. In FIG. 7, FOG terminals 30 are shown and the inspection terminals 50 are omitted. Herein after, a simple term of a terminal means a FOG terminal 30. The FOG terminal 30 in FIG. 7 is e.g. a rectangle; a length of the major axis is e.g. 100 micron and a length of the minor axis is e.g. 10 micron. However, the FOG terminal 30, the COG terminal or the Inspection terminal 50 can be other shape than a rectangle; and the major axes of the terminals can be tilted with respect to y direction in FIG. 7. In FIG. 7, the first organic passivation 108 and the second organic passivation 110 extend from the display area 90 to the terminal area 160. The large through hole 41 is formed in the first organic passivation film 108; the large through hole 42 is formed in the second organic passivation film 110. The through hole 41 in the first organic passivation film 108 can be referred to as the removed portion 41 of the first organic passivation film 108 in the terminal area 160; the through hole 42 in the second organic passivation film 110 can be referred to as the removed portion 42 of the second organic passivation film 110 in the terminal area 160.

Many terminals 30 are arranged in x direction in the through hole 41. Each of the terminals 30 is connected to the display area 90 through the lead wire 35. The discharge line 36 extends from each of the terminals 30 to the edge of the terminal area 160 of the insulating substrate 100. In the state of the mother substrate, the discharge lines 36 connect with the discharge lines 36 of other liquid crystal display panels, and connect with an earth line of the mother substrate; thus, prevent breaking of wirings or TFTs due to electro static charges during the manufacturing process.

Figure 8:
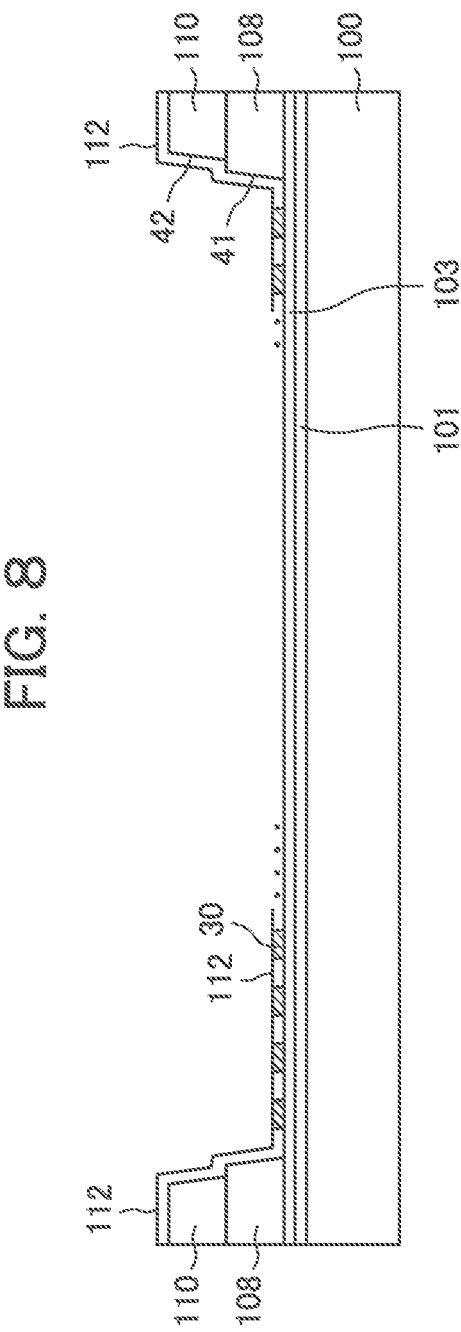
FIG. 8 is a cross sectional view of FIG. 7 along the line B-B.

FIG. 8 is a cross sectional view of FIG. 7 along the line B-B. In FIG. 8, the under coat film 101 is formed on the insulating substrate 100 and the gate insulating film 103 is formed on the under coat film 101. The terminals 30 are formed on the gate insulating film 103. The terminals 30 are formed on the terminal metals, which are formed on the same layer as the gate electrode 104. The interlayer insulating film and the terminal metals are omitted in FIG. 8.

In FIG. 8, the first organic passivation film 108 and the second organic passivation film 110 are remained at both sides of the terminal array. Namely, the terminal array is formed in the through hole 41 of the first organic passivation film 108 and the through hole 42 of the second organic passivation film 110. The capacitance insulating film 112, formed from SiN, is formed as a protective film all over the terminal area 160 except the terminals 30.

Figure 9:
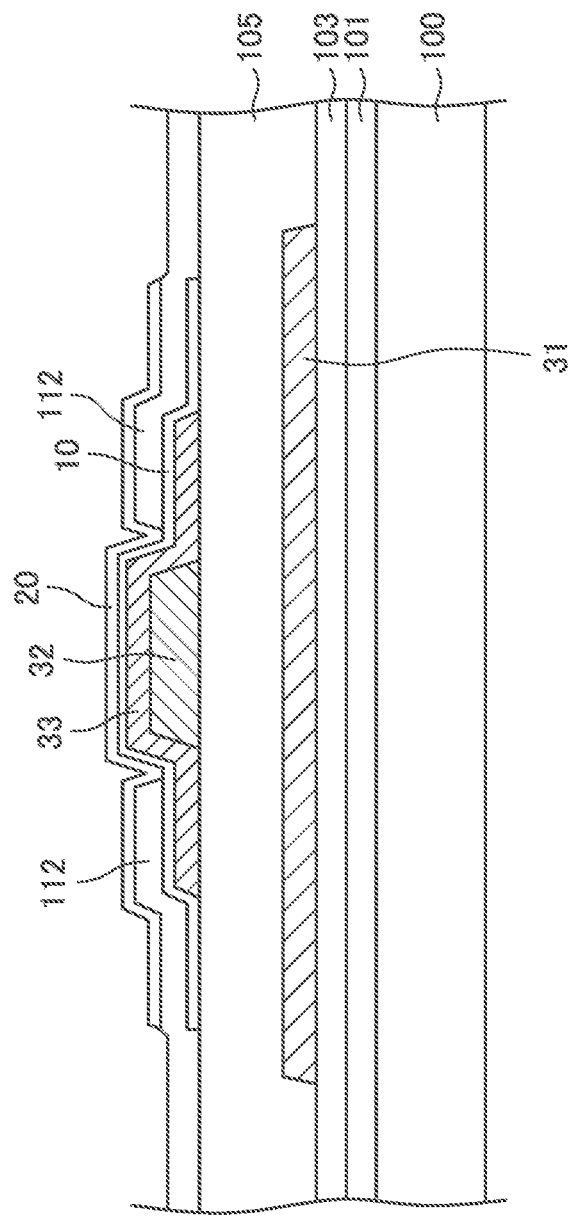
FIG. 9 is a cross sectional view of FIG. 7 along the line C-C.

FIG. 9 is a cross sectional view of FIG. 7 along the line C-C. In FIG. 9, the under coat film 101 is formed on the insulating substrate 100 and the gate insulating film 103 is formed on the under coat film 101. The first terminal metal 31, formed on the same layer as the gate electrode 104, is formed on the gate insulating film 103. The first terminal metal 31 is identical as the terminal wiring 35, which extends to the display area 90. In this case, the first terminal metal 31 is formed from MoW alloy.

In FIG. 9, the interlayer insulating film 105 is formed covering the first terminal metal 31. The second terminal metal 32, which is formed on the same layer as the video signal line 92, is formed on the interlayer insulating film 105. Namely, the structure of the second terminal metal 32 is a laminated metal of TiN/Ti/Al/Ti. The terminal wirings 35, which extend to the display area 90, can be formed on the same layer as the video signal lines 92 or the second terminal metal 32. In such a case, the first terminal metal 31 is not necessary unlike FIG. 9.

The third terminal metal 33, which is formed in the same layer as the common wiring 109, is formed on the second terminal metal 32. The common wiring 109 is formed either from TiN/Ti/Al/Ti or Mo/Al/Mo; in the case of FIG. 9, the structure of Mo/Al/Mo is used.

In FIG. 9, the first ITO film 10, formed on the same layer as the common electrode 111, is formed on the third terminal metal 33. The capacitance insulating film 112 as a protective film is formed covering the edge of the first ITO film 10. In the connecting region of the terminal, the through hole is formed in the capacitance insulating film 112 to expose the first ITO film 10. The second ITO film 20, which is formed on the same layer as the pixel electrode 113, is formed covering the interlayer insulating film 112 and the first ITO film 10.

Figure 10:
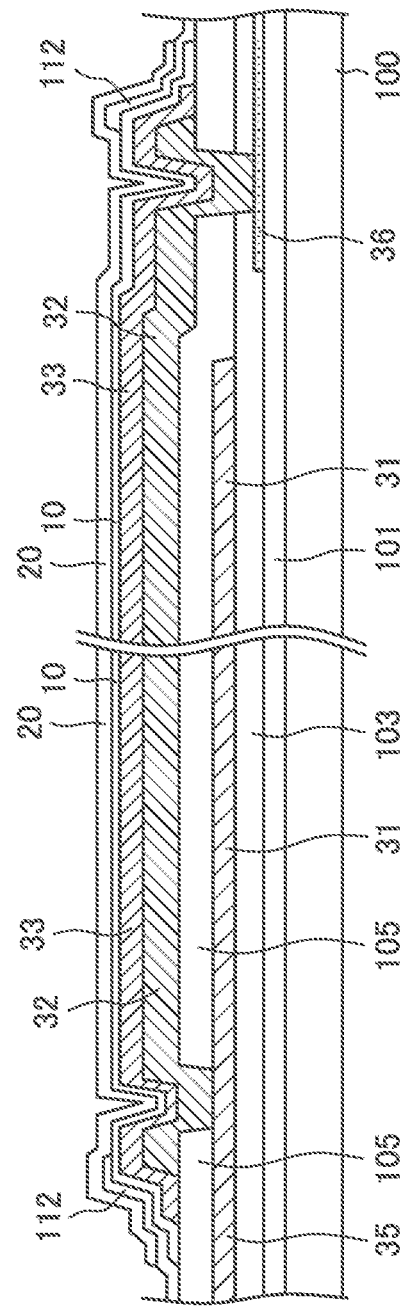
FIG. 10 is a cross sectional view of FIG. 7 along the line D-D.

FIG. 10 is a cross sectional view of FIG. 7 along the line D-D. In FIG. 10, the under coat film 101 is formed on the insulating substrate 100 and the gate insulating film 103 is formed on the under coat film 101. The first terminal metal 31, formed on the same layer as the gate electrode 104, is formed on the gate insulating film 103. The first terminal metal 31 is identical as the terminal wiring 35, which extends to the display area 90. The interlayer insulating film 105 is formed covering the first terminal metal 31. The second terminal metal 32, which is formed on the same layer as the video signal line 92, is formed on the interlayer insulating film 105. The second terminal metal 32 connects with the first terminal metal 31 via the through hole formed in the interlayer insulating film 105.

The third terminal metal 33, which is formed on the same layer as the common wiring 109, is formed on the second terminal metal 32. The first ITO film 10, formed on the same layer as the common electrode 111, is formed on the third terminal metal 33. In the terminal, the first ITO film is covered by the capacitance insulating film 112 at the edge; however, the first ITO film 10 is covered by the second ITO film 20, which is formed on the same layer as the pixel electrode 113, in the connecting region of the terminal.

By the way, the second terminal metal 32 connects with the discharge line 36, which is formed from the semiconductor film 102, via the through hole formed in the interlayer insulating film 105 and the gate insulating film 103. Impurity is doped in the semiconductor film 102 that constitutes the discharge line 36; thus, the discharge line 36 is conductive. The discharge lines 36 eliminate electro static charges generated in the manufacturing process.

In FIG. 10, the first terminal metal 31 or the terminal wirings 35 are electrically connected to the scan signal line 91, the video signal line 92, or the common wring 109 and so forth in the display area 90. The wirings between the display area 90 and the terminal wirings 35 are not always on the same layer; the wirings from the display area 90 reach to the terminals changing the layers via through holes. Among them, a problem arises when through holes or removed portions are formed in the first organic passivation film 108 or in the second organic passivation film 110.

Figure 11:
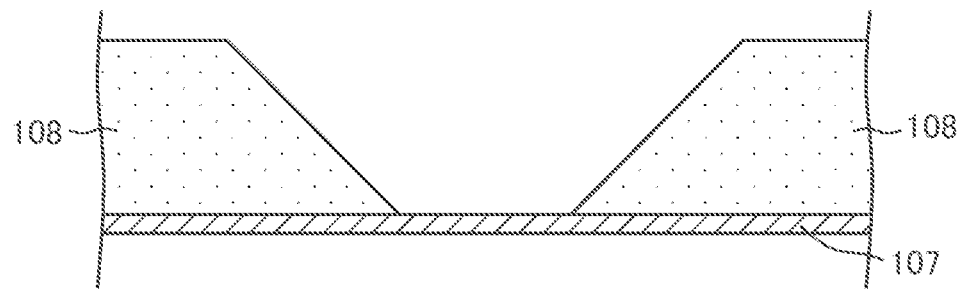
FIG. 11 is an example in which the through hole that does not have a problem is formed in the first organic passivation film.
Figure 12:
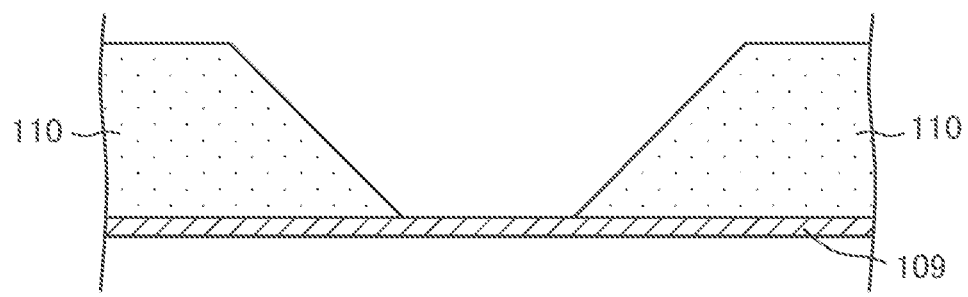
FIG. 12 is an example in which the through hole that does not have a problem is formed in the second organic passivation film.

FIG. 11 is an example that the through hole is formed in the first organic passivation film 108, which is formed on the source electrode 107 or the electrode formed on the same layer. FIG. 12 is an example that the through hole is formed in the second organic passivation film 110, which is formed on the common wiring 109 or the electrode formed on the same layer. FIGS. 11 and 12 are the examples that the though holes do not have a problem.

Figure 13:
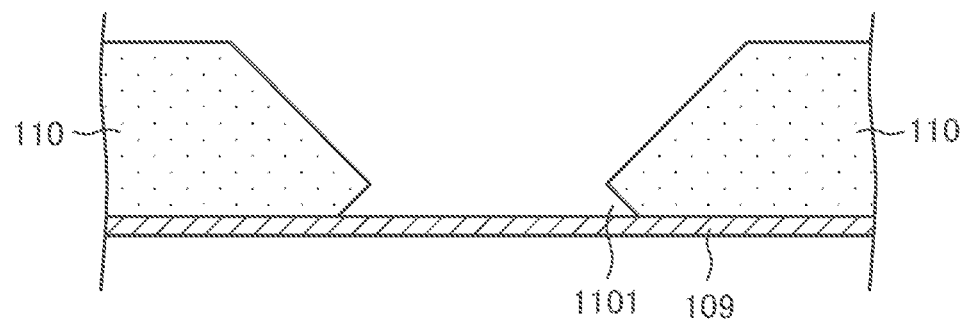
FIG. 13 is a cross sectional view in which the through hole formed in the second organic passivation film has an overhang.

In the through holes in the organic passivation film in the actual manufacturing process, however, there is a chance that the problem as shown in FIG. 13 arises. FIG. 13 shows the through hole in the second organic passivation film 110 formed on the common wirings 109; however, the same problem can occur when the through hole in the first organic passivation film 108 is formed on the electrode formed on the same layer as the source electrode 107 or the video signal line 92.

Figure 14:
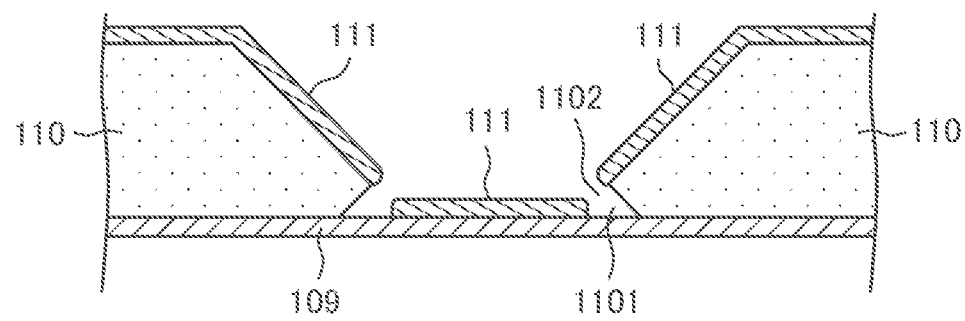
FIG. 14 is a cross sectional view in which the common electrode is disconnected in the through hole due to the overhang in the second organic passivation film.

In FIG. 13, the overhang 1101 is formed in the cross sectional view of the through hole in the second organic passivation film 110. Hereinafter the overhang 1101 may be referred to as the notch 1101. When such overhang 1101 is formed, a disconnection occurs in the through hole as depicted in FIG. 14. FIG. 14 is an example that common electrode 111 is intended to connect to the common wiring 109 in the through hole; however, the connection fails because the common electrode 111 is broken at the overhang 1101 in the through hole in the second organic passivation film 110.

Such an overhang 1101 is due to a local cell action of the common wiring 109 caused by developing solution to develop the through hole in the second organic passivation film 110. Common wiring 109 can be formed from TiN/Ti/Al/Ti or Mo/Al/Mo. In both cases, the stacked structure of the lamination has metals of different ionization tendencies; thus, the local cell action is generated in existence of the developing solution. Charges formed by the local cell action activate the developing solution; thus, the second organic passivation film 110 in the vicinity of the common wiring 109 is abnormally etched.

In the meantime, current flows when local cell action is generated. The terminal and the display area 90 are connected with each other by wirings. Generally, the through holes formed in the terminals are much larger compared with the through holes formed in the display area 90 or formed in the intermediate area. Consequently, due to a difference in local cell actions, the current flows from the terminal side to the display area side. In such a case, the overhang 1101 shown in FIG. 13 is generated.

Figure 15:
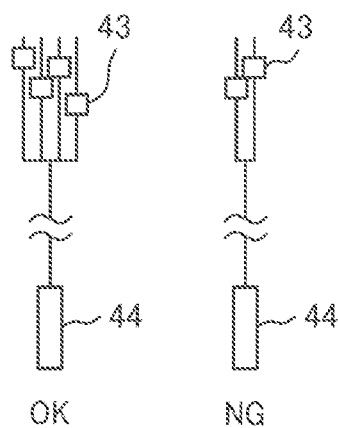
FIG. 15 is a schematic plan view that explains a reason why the overhang is formed in a small through hole.
Figure 16:
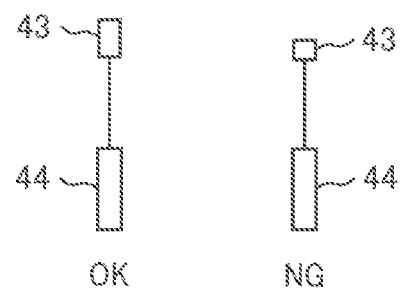
FIG. 16 is a schematic plan view that explains another reason why the overhang is formed in a small through hole.
Figure 19:
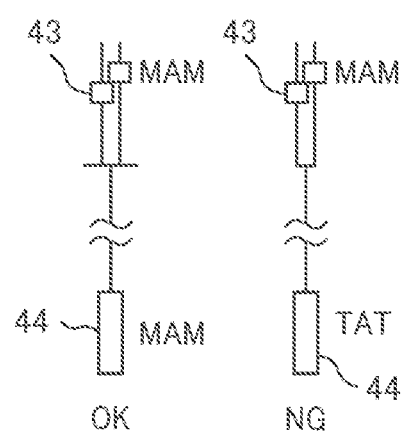
FIG. 19 is a schematic plan view which explains that kinds of the metals under the though hole influence a generation of the overhang in the through hole.

FIG. 15 is a schematic plan view that shows above explained problem. The left-hand figure in FIG. 15 shows that four small through holes 43 in e.g. the display area 90 correspond to one large terminal through hole 44. The right-hand figure in FIG. 15 shows that two small through holes 43 in e.g. the display area 90, the intermediate area or the peripheral area 95, correspond to one large terminal through hole 44. When the area of the through hole 44 of the terminal and the area of the summation of through holes 43 in e.g. the display area are compared, the difference is smaller in the left-hand figure and the difference is bigger in the right-hand figure. In such a case, the overhang 1101 is generated in the small through holes 43 in the right-hand figure of FIG. 15. In FIGS. 15, 16 and 19, the notation of "OK" means the overhang is not generated, and the notation of "NG" means the overhang is generated.

FIG. 16 shows the through hole 44 in the terminal and the through hole 43 in the display area 90, intermediate area, or the peripheral area 95 correspond by 1:1. In the left-hand figure of FIG. 16, the difference in area between the through hole 44 in the terminal and the through hole 43 in the display area 90 is small; in the right-hand figure of FIG. 16, the difference in area between the through hole 44 in the terminal and the through hole 43 in the display area 90 is big. The overhang is generated in the small through hole 43 in the structure of right-hand figure of FIG. 16.

Figure 17:
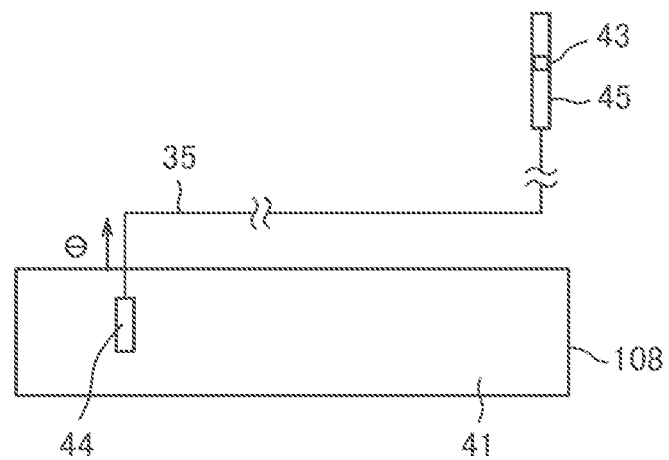
FIG. 17 is a schematic plan view that explains a reason why the overhang is formed in a small through hole in a structure of the liquid crystal display device.

FIG. 17 shows that the content explained above is applied to the structure of FIG. 7. In FIG. 17, a large through hole 41 is formed in the first organic passivation film 110 in the terminal area 160. Therefore, all the terminals 44 are exposed to the developing solution during the through hole 41 in the first organic passivation film 108 is formed. Specifically, during the forming of a big through hole 41, the side surface of the aluminum layer, which is an intermediate layer in the second terminal metal 32, is exposed to the developing solution in large area and for a long period, as depicted in FIGS. 9 and 10; thus, a large quantity of the aluminum in the second terminal metal 32 is ionized. On the other hand, the through hole 43 in the display area is much smaller compared with the through hole 41 in the terminal area; further, the through hole 43 in the display area is much smaller than the through hole 44 in the individual terminals. In FIG. 17, the notation 43 is the through hole in the display area and the notation 45 is an electrode under the through hole 43. Even the electrode 45 has a laminated structure of TAT as the second terminal metal, the side surface of the aluminum layer, which is an intermediate layer, is covered by the first organic passivation film 108, therefore, only the upper layer Ti is exposed to the developing solution; thus, ionization of the electrode 45 is small. As described above, a difference between the local cell action in the terminal and the local cell action in the through hole in the display area is very big; therefore, charges flow from the terminal area to the display area. Consequently, an abnormal etching in the organic passivation film 108 occurs in the through hole 43 in the display area, thus, overhang 1101 in the through hole 43 is generated.

Figure 18:
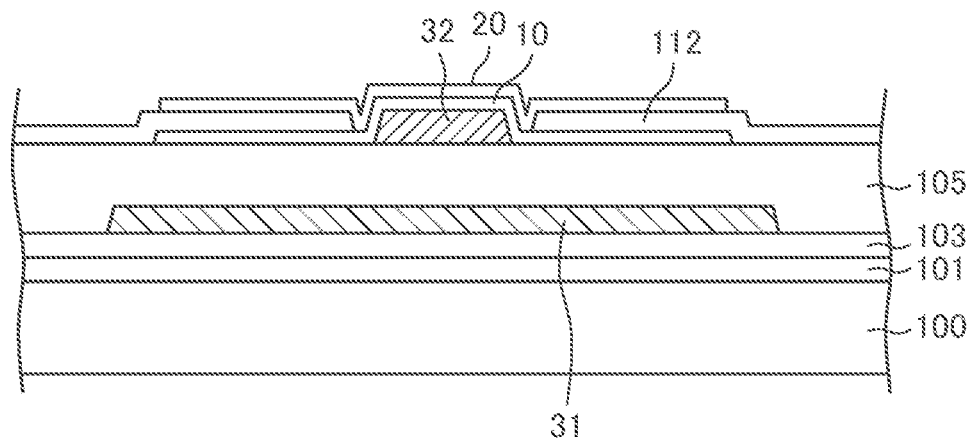
FIG. 18 is another cross sectional view of FIG. 7 along the line C-C.

FIGS. 18 and 19 show another example when the overhang is generated in the through hole. FIG. 18 is another cross sectional view of FIG. 7 along the line C-C. FIG. 18 differs from FIG. 9 in that the third terminal metal does not exist but the first ITO film 10 and the second ITO film 20 are formed directly on the second terminal metal 32. Namely, the through hole is formed on the second terminal metal 20, which has TiN/Ti/Al/Ti structure. In this case too, as shown in FIG. 17, a large through hole 41 is formed in the first organic passivation film 108 in the terminal area 160; small through hole 43 is formed in the display area 90.

In the left-hand figure of FIG. 19, both the through hole 44 in the terminal and the through hole 43 in the display area are formed on the electrode having Mo/Al/Mo structure (expressed as MAM in FIG. 19). The overhang is not generated in this structure. On the contrary, in the right-hand figure of FIG. 19, the through hole 44 in the terminal is formed on the electrode having TiN/Ti/Al/Ti (expressed as TAT in FIG. 19) structure; however, the through hole 43 in the display area 90 is formed on the electrode having Mo/Al/Mo structure (expressed as MAM in FIG. 19). The shapes of the through holes 44 in the terminal area and the shapes of the through holes 43 in the display area 90 are each the same between the left-hand figure and the right-hand figure in FIG. 19.

In such cases, the overhang in the through hole 43 is generated in the display area 90 in the right-hand figure of FIG. 19. Namely, the overhang tends to be generated in the small through hole when the metals under the through holes are different between the through hole 44 in the terminal area 160 and the through hole 43 in the display area 90, that is to say, between a larger through hole and a smaller through hole. In other words, when laminated metals under the through holes are different between the through holes 44 in the terminal area 160 and the through holes 43 in the display area 90, the overhang tends to be generated in the small through hole 43.

In any events, the overhang generated in the small through hole in the display area 90 or the though hole in the intermediate area, which is the area between the display area 90 and the terminal area 160, is caused by substantial differences in the areas of the metals exposed by the thorough holes. The embodiments below show the structure that countermeasures the overhang in the though hole based on the above explained mechanism.

Embodiment 1

Figure 20:
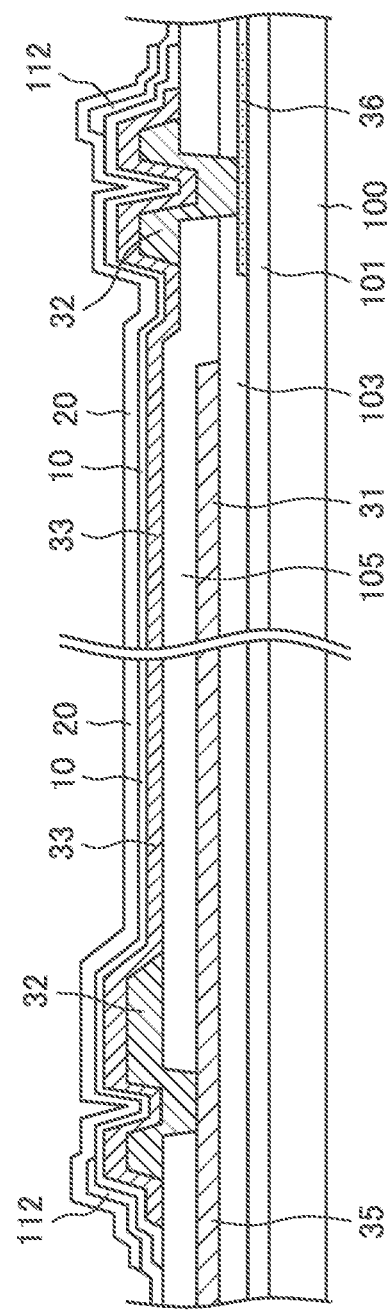
FIG. 20 is a cross sectional view of the terminal in FIG. 7 along the line D-D according to embodiment 1.

FIG. 20 is a cross sectional view of the terminal in FIG. 7 along the line D-D. FIG. 20 differs from FIG. 10 in that the second terminal metal 32 formed from TiN/Ti/Al/TI is eliminated from the terminal except the area in the vicinity of the through hole formed in the interlayer insulating film 105 for connection with the first terminal metal 31. Therefore, the area of the second terminal metal 32 in the terminal is made very small, which does not make a big difference with the area of the through hole in the first organic passivation film 108 in the display area and the like.

Consequently, when the through holes in the terminal area 160 and the through holes in the display area 90 and so forth are simultaneously made, the exposed area of the side surface of the aluminum layer, which is an intermediate layer in the second terminal metal 32, to the developing solution for the through hole is made small in the terminal area 160; and thus, ionization of the second terminal metal 32 can be suppressed, and movement of the charges is made small, consequently, the generation of overhang in the through hole in the first organic passivation film 108 or in the second organic passivation film 110 in the display area 90 and so forth can be suppressed. This structure is specifically effective to the through hole formed on the metal that is made from the same material as the video signal 92 of e.g. TiN/Ti/Al/Ti in the display area 90 and so forth.

By the way, in FIG. 20, the second terminal metal 32 remains at the portion that connects with the discharge line 36; this portion, however, does not connect with the display area 90 when the terminal through hole, e.g. 41, is formed, therefore, does not have an influence to the overhang in the through holes in the display area 90 and so forth.

Figure 21:
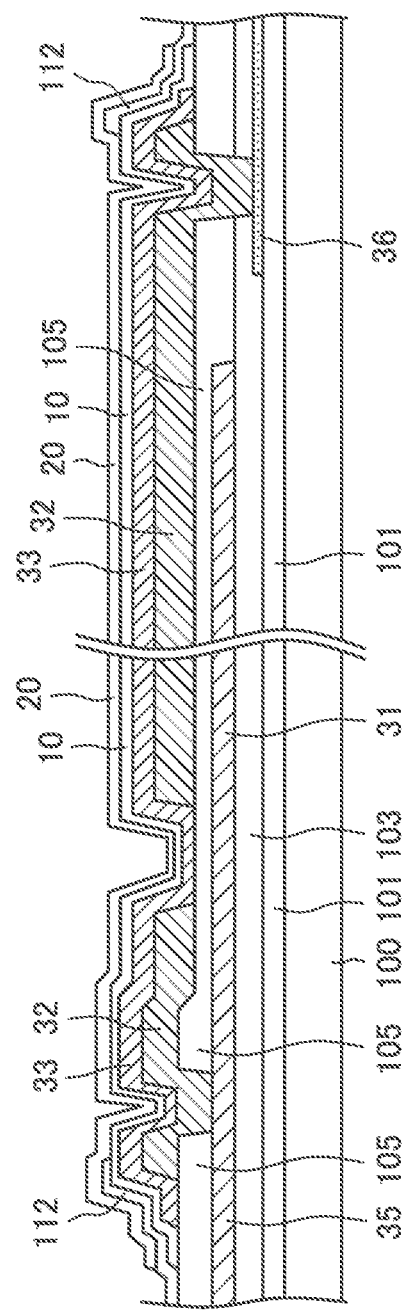
FIG. 21 is a cross sectional view of another example of embodiment 1.

FIG. 21 is a cross sectional view of another example of embodiment 1. FIG. 21 differs from FIG. 20 in that the second terminal metal 32 is divided at the vicinity of the through hole in the interlayer insulating film 105 for connection with the first terminal metal 31, however, the second terminal metal 32 substantially remains in the terminal including the area at the through hole for connection with the discharge line 36. In this case, too, the remaining portion of the second terminal metal 32 does not connect with the display area 90 when the terminal through hole, e.g. 41, is formed, therefore, does not have an influence to the overhang in the through holes in the display area 90 and so forth.

Embodiment 2

Figure 22:
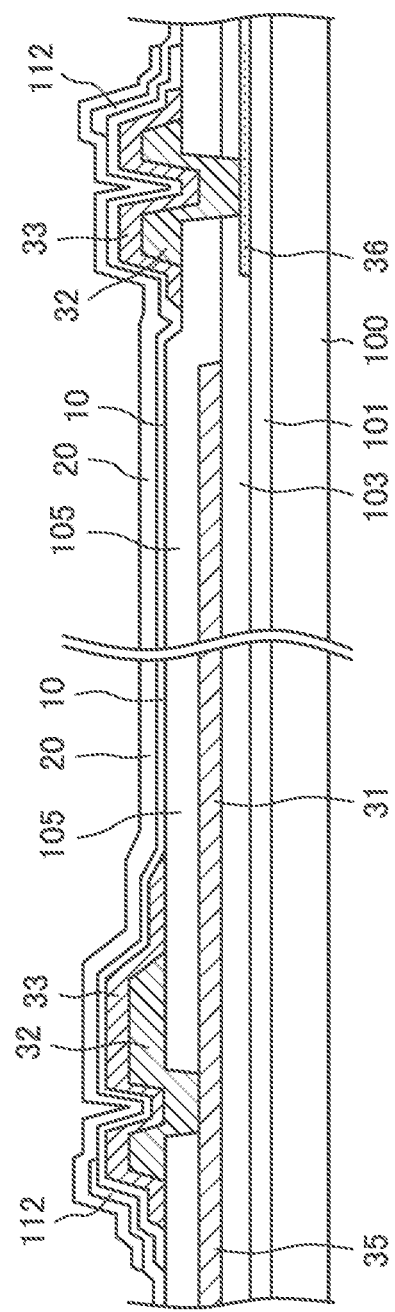
FIG. 22 is a cross sectional view of the terminal according to embodiment 2.

FIG. 22 is a cross sectional view of the terminal according to embodiment 2. FIG. 22, is a cross sectional view of FIG. 7 along the line D-D. FIG. 22 differs from FIG. 20 in that the third terminal, too, is eliminated from the terminal except the area in the vicinity of the through hole formed in the interlayer insulating film 105. Therefore, the area of the third terminal metal 33 in the terminal is made very small, which does not make a big difference with the area of the through hole in the display area and the like.

Consequently, when the through holes in the terminal area 160 and the through holes in the display area 90 and so forth are simultaneously made, the exposed area of the side surface of the aluminum layer, which is an intermediate layer in the second terminal metal 32, and the exposed area of the side surface of the aluminum layer, which is an intermediate layer in the third terminal metal 33, to the developing solution for the through hole are made small in the terminal area 160; and thus, ionization of the second terminal metal 32 and the third metal 33 can be suppressed, and movement of the charges made small, consequently, a generation of overhang in the through hole in the first organic passivation film 108 or in the second organic passivation film 110 in the display area 90 and so forth can be suppressed. This structure is specifically effective to the through hole formed on the metal that is made from the same material as the common wiring 109 of e.g. Mo/Al/Mo in the display area 90 and so forth. This structure is also effective to the through hole formed on the metal that is made from the same material as the video signal 92 of e.g. TiN/Ti/Al/Ti in the display area 90 and so forth as explained in embodiment 1.

By the way, in FIG. 22, the third terminal metal 33 remains at the portion that connects with the discharge line 36; this portion, however, does not connect with the display area 90 when the terminal through hole, e.g. 41 or 42, is formed; therefore, does not have an influence to the overhang in the through holes in the display area 90 and so forth.

Another feature of FIG. 22 is that an edge of the second terminal metal 32 is covered by the third terminal metal 33. Therefore, the edge of the second terminal metal 32 is protected by the third terminal metal 33. Namely, only the third terminal metal is necessary to be taken care of against the corrosions caused by external air.

Embodiment 3

Figure 23:
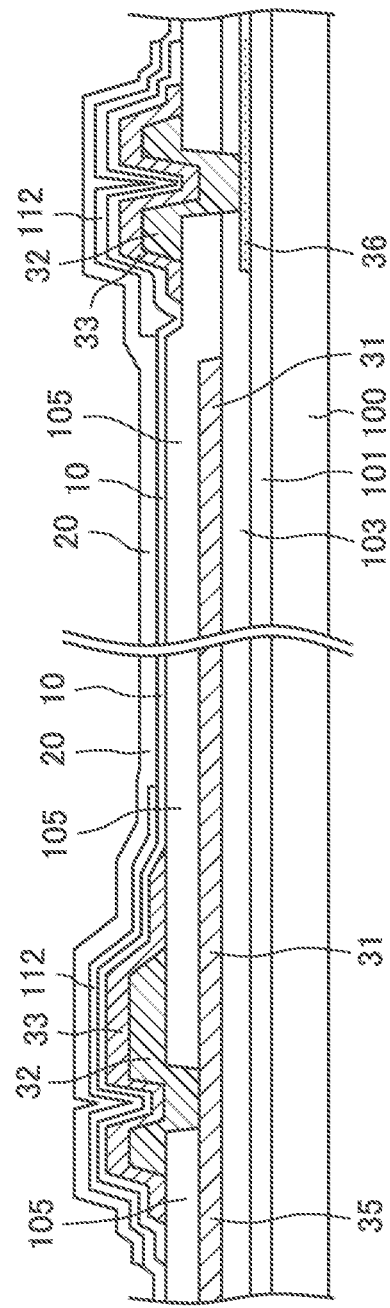
FIG. 23 is a cross sectional view of the terminal according to embodiment 3.

FIG. 23 is a cross sectional view of the terminal according to embodiment 3. FIG. 23, too, is a cross sectional view of FIG. 7 along the line D-D. FIG. 23 differs from FIG. 22 in that the remaining third terminal metal 33 is covered by the capacitive insulating film 112. Therefore, the effects of the invention to the cross sectional view of the through holes in the display area 90 are the same as explained in embodiment 2.

In FIG. 23, the third terminal metal 33 is covered by the capacitive insulating film 112. Moisture cannot permeate the capacitive insulating film 112, which is formed from SiN. Therefore, the third terminal metal 33 formed from Mo/Al/Mo and the second terminal metal 32 formed from TiN/Ti/AL/Ti are protected by the capacitive insulating film 112 from the external air; thus, reliability of the terminals can be improved.

Embodiment 4

Figure 24:
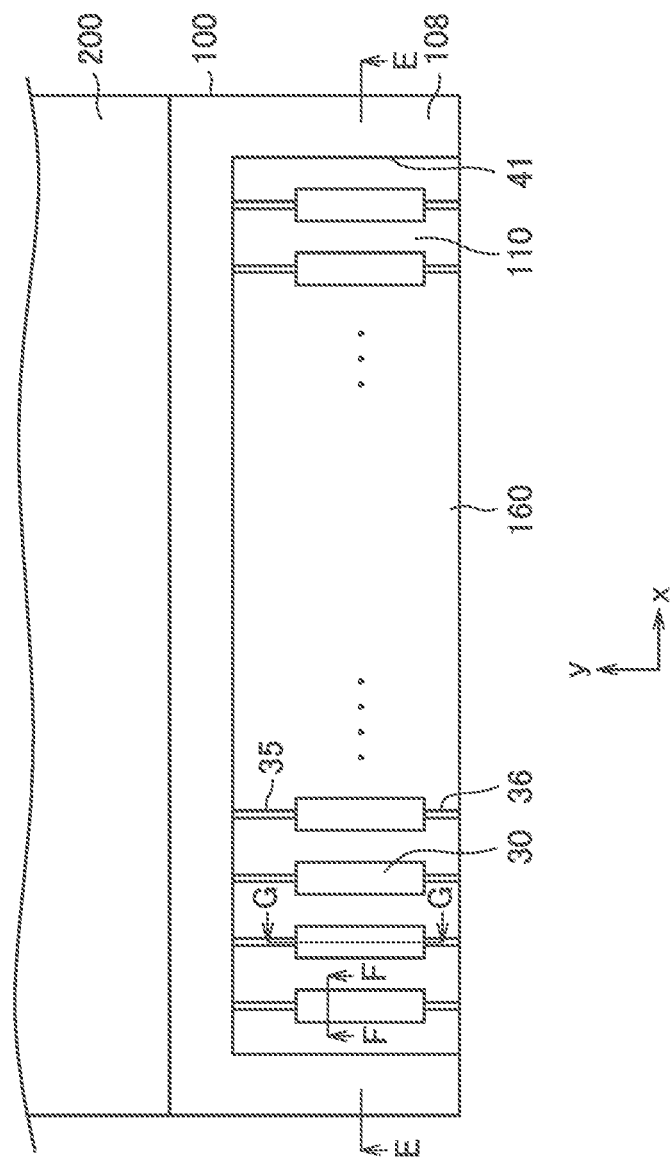
FIG. 24 is a plan view of the terminal area 160 according to embodiment 4.

FIG. 24 is a plan view of the terminal area 160 according to embodiment 4. FIG. 24 differs from FIG. 7 in that: a large through hole common to all the terminals is not formed in the second organic passivation film 110, but the through holes in the second passivation film 110 are formed in individual terminals 30. On the other hand, a large through hole 41 common to all the terminals 30 in the terminal area 160 is formed in the first organic passivation film 108. Other structures are the same as FIG. 7.

Figure 25:
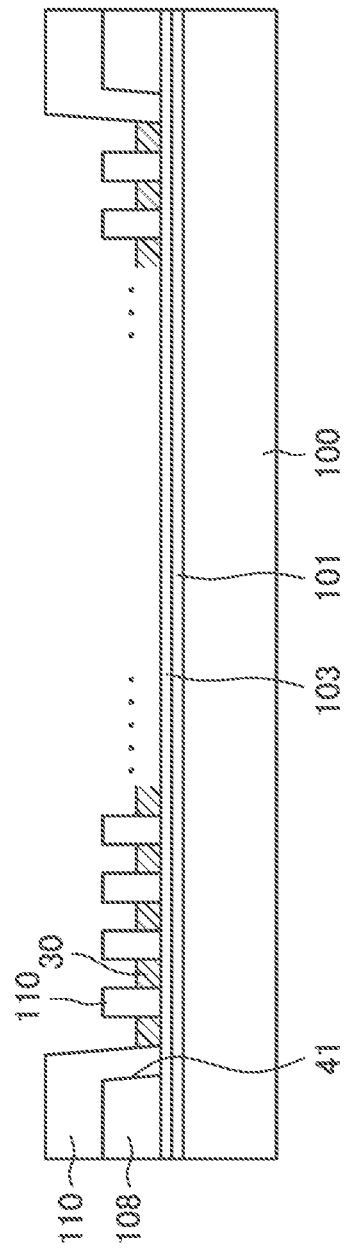
FIG. 25 is a cross sectional view of FIG. 24 along the line E-E.

FIG. 25 is a cross sectional view of FIG. 24 along the line E-E. FIG. 25 differs from FIG. 8 in that the second organic passivation film 110 exists between the terminals 30. On the other hand, the through hole 41 (or the removed portion 41 of the first organic passivation film) is formed as a large through hole common to all the terminals 30.

Figure 26:
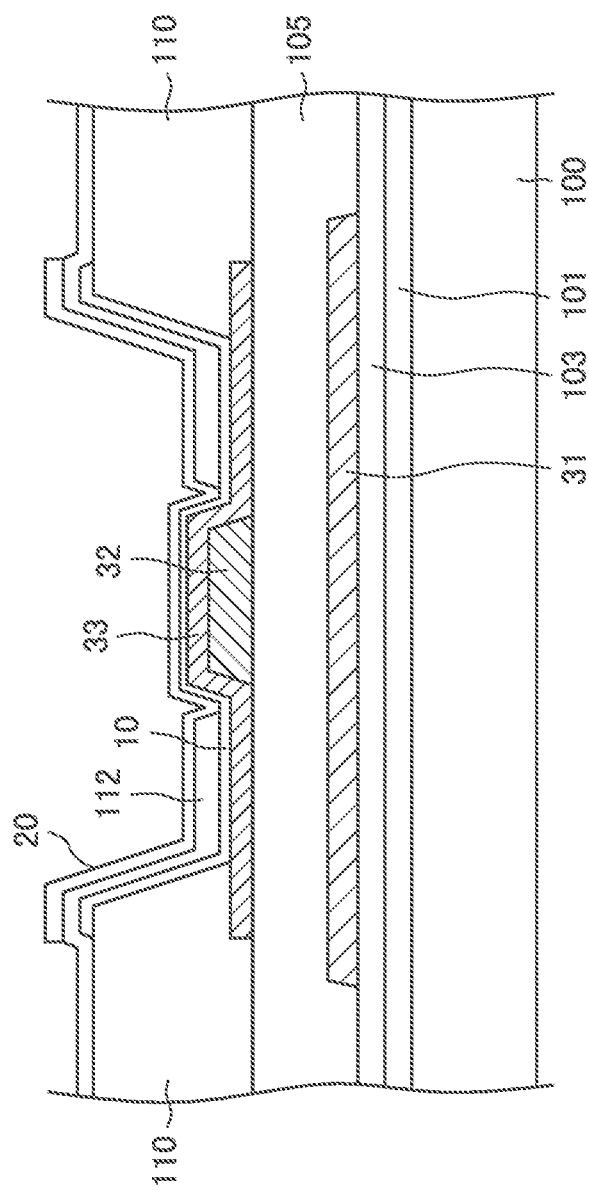
FIG. 26 is a cross sectional view of FIG. 24 along the line F-F.

FIG. 26 is a cross sectional view of the terminal according to embodiment 4, which corresponds to the cross sectional view of FIG. 24 along the line F-F. FIG. 26 differs from FIG. 9 in that the edge of the third terminal metal 33 is covered by the second organic passivation film 110. The third terminal metal 33 is e.g. formed from Mo/Al/Mo, which contains aluminum, which is prone to corrosion. In the structure of FIG. 26, the edge of the Mo/Al/Mo structure is protected by the second organic passivation film 110, therefore, the second organic passivation film 110 is not developed in the area that includes the side surface of aluminum layer exists, namely, the side surface of the aluminum layer is not exposed to the developing solution; thus, ionization of the third terminal metal 33 is suppressed, and a generation of the notch 1101 in the second organic passivation film 110 in the through hole is suppressed, consequently, the reliability of the connection in the through hole can be improved. Other structures of FIG. 26 are the same as FIG. 9. Further, only the upper Ti layer or the upper Mo layer of the third terminal metal 33 is exposed by the through hole formed in the second organic passivation film 110, and the aluminum layer, which is an intermediate layer of the third terminal metal 33, is not exposed by the through hole in the second organic passivation film 110.

Figure 27:
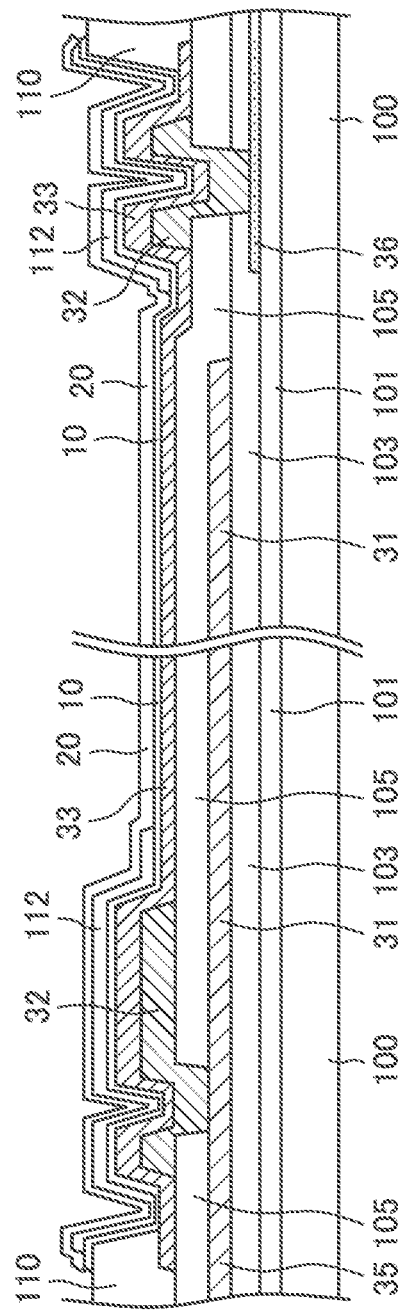
FIG. 27 is a cross sectional view of FIG. 24 along the line G-G.

FIG. 27 is a cross sectional view of the terminal according to embodiment 4, which corresponds to the cross sectional view of FIG. 24 along the line G-G. FIG. 27 differs from FIG. 10 of embodiment 1 in that the edge of the third terminal metal 33 is covered by the second organic passivation film 110. Namely, as explained in FIG. 26, the edge of the third terminal metal 33 is protected by the second organic passivation film 110, thus, a reliability of the terminals can be improved.

Another point that FIG. 27 differs from FIG. 20 is that the capacitance insulating film 112, which works as a protective film, is formed to cover the remained second terminal metal 32. According to this structure, all the second terminal metal 32 and a part of the third terminal metal 33 are protected from external air. Owing to the structure explained above, corrosion resistance in the terminals in embodiment 4 is improved compared with the structure of embodiment 1 and so forth.

Other structures in FIG. 27 are the same as FIG. 20. Therefore, in embodiment 4, too, as the same as embodiment 1, the overhang in the through hole formed in the first organic passivation film or in the second passivation film in the display area 90 or in the intermediate area can be suppressed. In the meantime, the structures in embodiment 2 and embodiment 3 can be combined with the structure of embodiment 4.

In the examples explained above, the first organic passivation film 108 and the second organic passivation 110 are used. However, the present invention can be applied even when the organic passivation film has only one layer. In this case, the through hole that is formed for an individual terminal 30 is formed in the first organic passivation film 108.

In the above examples, the present invention has been explained in regard to the liquid crystal display device; however, the present invention is applicable to the organic EL display device. The organic EL display device differs from the liquid crystal display device in that the organic EL layer including the light emitting layer is formed on the TFT substrate instead of the liquid crystal layer, and the protective film is formed to protect the organic EL layer. However, the organic EL display device is the same as the liquid crystal display device in that e.g. the terminal area exists and two layers of the organic passivation films exist in the display area and in the terminal area, and through holes are formed in both of the two organic passivation films.

What is claimed is:

1. A display device comprising:
    a display area and a terminal area in which terminals are formed; and
    a video signal line in the display area, wherein
    each of the terminals of the terminal area comprises a lead wire, which is formed from a first metal and extends to the display area,
    a first insulating film covers the lead wire,
    a second metal is formed on the first insulating film,
    a third metal is formed on a surface of the second metal,
    the first insulating film has a top surface, and a bottom surface opposed to the top surface,
    the video signal line is in contact with the top surface of the first insulating film,
    the lead wire is in contact with the bottom surface of the first insulating film,
    the second metal is made from a same material as the video signal line, and is in contact with the top surface of the first insulating film,
    the first insulating film has a first through hole and a second through hole,
    the second metal has a first portion that connects with the lead wire via the first through hole,
    the second metal has a second portion that overlaps the second through hole,
    the second portion is separated from the first portion,
    an area of each of the first portion and the second portion is smaller than an area of the third metal,
    each of the terminals of the terminal area further comprises an insulating substrate, a discharge line, and a second insulating film covering the discharge line,
    the discharge line is formed of a semiconductor material,
    the discharge line is formed between the insulating substrate and the second insulating film,
    the first insulating film is stacked on the second insulating film,
    the second through hole is formed through the second insulating film to expose the discharge line, and
    the second portion of the second metal connects with the discharge line via the second through hole.

2. The display device according to claim 1, further comprising a scan signal line in the display area,
    wherein
    the lead wire is made from a same material as the scan signal line, and is in contact with the bottom surface of the first insulating film,
    the lead wire is formed between the first insulating film and the second insulating film,
    the discharge line extends in a direction away from the lead wire.

3. The display device according to claim 1,
    wherein the third metal has a third portion that covers a top surface and a side surface of the first portion of the second metal, a fourth portion that covers a top surface and a side surface of the second portion of the second metal, and a fifth portion that contacts with the first insulating film at a place where the first portion and the second portion are separated, and
    the third portion, the fourth portion and the fifth portion are integrally formed.

4. The display device according to claim 3, wherein each of the terminals of the terminal area further comprises a first transparent conductive film and a second transparent conductive film,
    the second transparent conductive film is stacked on the first transparent conductive film, and
    the first transparent conductive film contacts with a top surface and a side surface of the third portion, a top surface and a side surface of the fourth portion, and a top surface of the fifth portion.

5. The display device according to claim 4,
    wherein an inorganic insulating film is formed between the first transparent conductive film and the second transparent conductive film, and,
    the inorganic insulating film covers a side surface of the third portion and a side surface of the fourth portion.

6. The display device according to claim 5,
    wherein the inorganic insulating film further covers a top surface of the third portion and a top surface of the fourth portion.

7. The display device according to claim 1,
wherein the third metal has a third portion that covers a top surface and a side surface of the first portion of the second metal, and a fourth portion that covers a top surface and a side surface of the second portion of the second metal, the third portion and the fourth portion are separated, the area of the first portion is smaller than an area of the third portion, and the area of the second portion is smaller than an area of the fourth portion.

8. The display device according to claim 7, wherein
each of the terminals of the terminal area further comprises a first transparent conductive film and a second transparent conductive film, the second transparent conductive film is stacked on the first transparent conductive film, and the first transparent conductive film contacts with a top surface and a side surface of the third portion, a top surface and a side surface of the fourth portion, and the first insulating film in an area that the third portion and the fourth portion are separated.

9. The display device according to claim 1,
wherein each of the terminals of the terminal area is rectangle, which has a pair of long sides and a pair of short sides, the first through hole is located in a vicinity of one of the short sides and the second through hole is located in a vicinity of another of the short sides.

10. The display device according to claim 1,
wherein an organic insulating film is formed surrounding each of the terminals in the terminal area, the organic insulating film contacts with at least a part of an outer edge of the third metal.

11. The display device according to claim 1,
wherein the first metal is formed integrally with the lead wire, and extends in a direction from the first through hole to the second through hole, an edge of the first metal is between the first through hole and the second through hole.

* * * * *